US012720713B1

(12) United States Patent
Chigullapalli et al.

(10) Patent No.: US 12,720,713 B1
(45) Date of Patent: Aug. 25, 2026

(54) MOAT HEATSINK FOR VRs IN HIGH POWER AI SERVERS

(71) Applicant: AMD Design, LLC, Wilmington, DE (US)

(72) Inventors: Sruti Chigullapalli, Secaucus, NJ (US); Sunilkumar Pinnu, Secaucus, NJ (US); Wojciech Marcin Serafin, Secaucus, NJ (US); Cong Yao, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 781 days.

(21) Appl. No.: 18/086,361

(22) Filed: Dec. 21, 2022

Related U.S. Application Data

(60) Provisional application No. 63/412,230, filed on Sep. 30, 2022.

(51) Int. Cl.
*H05K 7/20* (2006.01)

(52) U.S. Cl.
CPC ....... *H05K 7/2049* (2013.01); *H05K 7/20336* (2013.01)

(58) Field of Classification Search
CPC ......................... H05K 7/2049; H05K 7/20336
USPC ......................................................... 165/80.3
See application file for complete search history.

(56) References Cited

U.S. PATENT DOCUMENTS 6,459,582 B1 * 10/2002 Ali ...................... H10W 40/611 257/E23.084
6,490,161 B1 * 12/2002 Johnson ................ H10W 40/77 257/E23.09
6,680,848 B2 * 1/2004 Petit .................... H10W 40/611 361/704
7,428,154 B2 * 9/2008 Ishimine ............. H01L 23/4006 165/185
7,443,679 B2 * 10/2008 Li ......................... H10W 40/73 165/185
8,934,247 B2 * 1/2015 Chen ..................... H10W 40/60 361/688
10,262,919 B2 * 4/2019 Slight ................. H01L 23/4006
10,980,151 B2 * 4/2021 Bala ................... H05K 7/20454
2005/0254213 A1 * 11/2005 Wang ........................ G06F 1/20 361/697

(Continued)

FOREIGN PATENT DOCUMENTS

CN 105828557 A * 8/2016 ......... H05K 7/20509
CN 108684176 A * 10/2018 ........... H05K 5/0213

(Continued)

*Primary Examiner* — Jenna M Maroney
*Assistant Examiner* — Gustavo A Hincapie Serna
(74) *Attorney, Agent, or Firm* — Dergosits & Noah LLP; Todd A. Noah

(57) ABSTRACT

An apparatus is provided for cooling a first heat source surrounded by a plurality of second heat sources in which a second heat sink for the plurality of heat sources is attached to a first heat sink connected to the first heat source. The apparatus avoids requiring dedicated mounts on the device for the second heat sink by employing the first heat sink to effectively sandwich the second heat sink against the plurality of heat sources. Embodiments further enhance the heat transfer by distributing heat pipes within fins of the first heat sink and by facing two sides of the first heat sink to create a duct through which airflow is channeled.

19 Claims, 5 Drawing Sheets

(56) References Cited

U.S. PATENT DOCUMENTS

| | | | | |
|---|---|---|---|---|
| 2006/0087816 | A1* | 4/2006 | Ewes | H10W 40/774 257/E23.088 |
| 2007/0181286 | A1* | 8/2007 | Wang | H01L 23/467 257/E23.099 |
| 2008/0135215 | A1* | 6/2008 | Wu | H10W 40/73 257/E23.084 |
| 2009/0168355 | A1* | 7/2009 | Ma | H10W 40/43 165/185 |
| 2009/0219390 | A1* | 9/2009 | Dugan | G07C 9/20 348/143 |
| 2009/0236076 | A1* | 9/2009 | Min | F28D 15/0275 165/151 |
| 2009/0279251 | A1* | 11/2009 | Liu | H05K 7/20336 165/80.3 |
| 2011/0120668 | A1* | 5/2011 | Li | F28D 15/02 165/104.26 |
| 2011/0127006 | A1* | 6/2011 | Lu | H01L 23/467 165/67 |
| 2011/0155351 | A1* | 6/2011 | Li | H01L 23/467 165/104.26 |
| 2012/0092826 | A1* | 4/2012 | Heidepriem | H01L 23/4006 361/679.54 |
| 2016/0106003 | A1* | 4/2016 | Bosak | H05K 7/20509 361/717 |
| 2016/0276243 | A1* | 9/2016 | Smalley | H01L 23/4093 |
| 2018/0054915 | A1* | 2/2018 | Achard | H05K 7/2039 |
| 2018/0080717 | A1* | 3/2018 | Kawabata | F28D 15/0275 |
| 2018/0235070 | A1* | 8/2018 | Brocklesby | G06F 1/20 |
| 2019/0132938 | A1* | 5/2019 | Mira | H05K 1/0203 |
| 2019/0200479 | A1* | 6/2019 | Yatskov | H01L 23/3672 |
| 2019/0378829 | A1* | 12/2019 | Patel | H10W 90/00 |
| 2020/0068745 | A1* | 2/2020 | Lin | H05K 7/20336 |
| 2020/0126889 | A1* | 4/2020 | Mao | H01L 23/427 |
| 2021/0105913 | A1* | 4/2021 | Au | F28F 27/00 |
| 2021/0121881 | A1* | 4/2021 | Imamura | B01L 3/502746 |
| 2021/0305125 | A1* | 9/2021 | Kugman | H01L 23/4006 |
| 2021/0307153 | A1* | 9/2021 | Mohammad | H05K 1/0203 |
| 2021/0327785 | A1* | 10/2021 | Lin | F28D 15/0275 |
| 2021/0345519 | A1* | 11/2021 | Tian | H05K 7/20809 |
| 2021/0407879 | A1* | 12/2021 | Patel | H01L 23/3672 |
| 2022/0022339 | A1* | 1/2022 | Chen | F28D 15/046 |
| 2022/0107139 | A1* | 4/2022 | Takao | F28D 15/04 |
| 2022/0230936 | A1* | 7/2022 | Zhong | H10W 40/611 |
| 2023/0307317 | A1* | 9/2023 | Chang | H10W 40/73 |
| 2024/0114646 | A1* | 4/2024 | Jaggers | G06F 1/20 |
| 2025/0063689 | A1* | 2/2025 | Li | H05K 7/20772 |
| 2025/0169030 | A1* | 5/2025 | Edmunds | H05K 7/20254 |

FOREIGN PATENT DOCUMENTS

| | | | | | |
|---|---|---|---|---|---|
| CN | 113410188 | A | * | 9/2021 | H01L 23/467 |
| CN | 215689687 | U | * | 2/2022 | |
| TW | 202204842 | A | * | 2/2022 | F28F 1/12 |
| WO | WO-0108460 | A1 | * | 2/2001 | H10W 40/641 |
| WO | WO-2021119359 | A1 | * | 6/2021 | G01R 31/2874 |
| WO | WO-2021218963 | A1 | * | 11/2021 | H10D 18/00 |

* cited by examiner 100
120
136
118
122a
122k
114
110
112
146a
140b
140d
116b
116d
142b
142d
138b
138d
134a
130
146
116a
134b
142a
138a
140a

MOAT HEATSINK FOR VRs IN HIGH POWER AI SERVERS

CROSS-REFERENCE TO RELATED CASES

This application claims priority to U.S. Provisional Patent Application No. 63/412,230, filed on Sep. 30, 2022, which is hereby incorporated by reference in its entirety.

BACKGROUND

As computing requirements have grown, and as shown in FIG. 1, CPU/GPU chips 12*a*, 12*b*, which are a source of heat, have required higher wattage and voltage. As a result, VRs (Voltage Regulators), which are another source of heat, 16*a* . . . 16*e* have needed to work at higher power and, in turn, run hotter. The number of VRs has increased so that they no longer occupy only one side of the CPU/GPU, e.g., VR row 14*a*. Instead, as shown in FIG. 1, VRs now may cover all four sides of the socket and be extremely close to the high-speed routing for PCIE/UPI/XGMI, as shown with VR rows 14*a* . . . 14*f*. Thus, there is extremely limited space for mounting holes for separate VR heatsinks on baseboard 10.

Therefore, an innovative solution for cooling VRs is needed that does not compromising serviceability, does not require additional mounting holes, and does not compromise the shock and vibration-handling capabilities of the board.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a heatsink that employs a separate heat spreader for the VRs and one for the CPU/GPU, yet may be attached to the baseboard as a single unit using mounting locations for a CPU/GPU heatsink. The attachment as a single unit is facilitated by elements of the CPU/GPU section of the heat sink overhanging elements of the VR section of the heat sink. Thus, when the CPU/GPU section is attached to the existing CPU/GPU mounts, the CPU/GPU section sandwiches the VR section in place.

Figure 1:
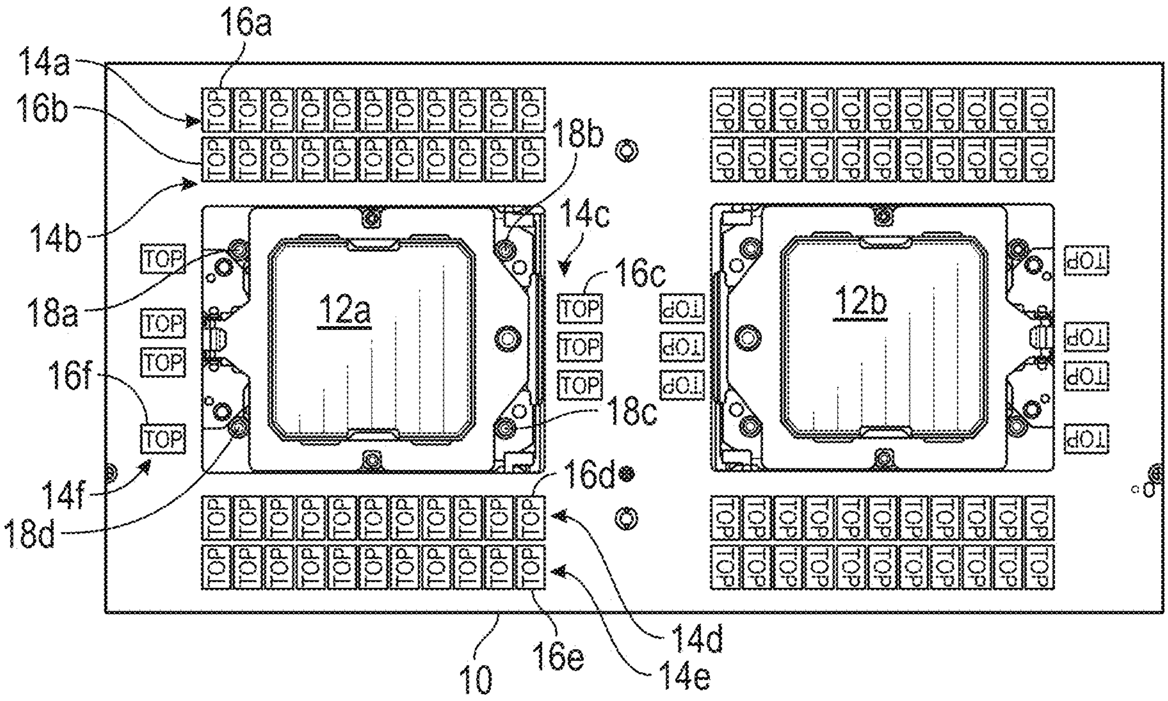
FIG. 1 is a top view of a prior art baseboard.
Figure 2:
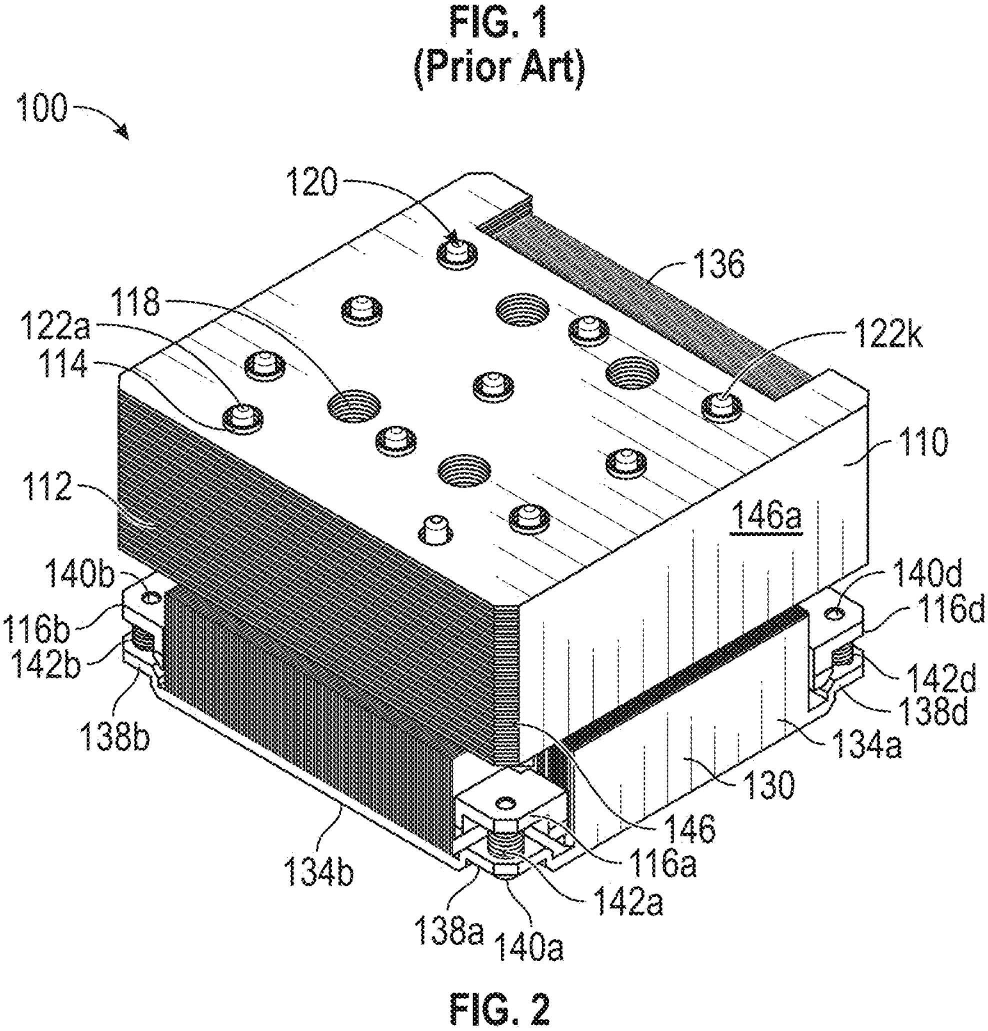
FIG. 2 is an upper front right isometric view of an embodiment of a moat heatsink.
Figure 3:
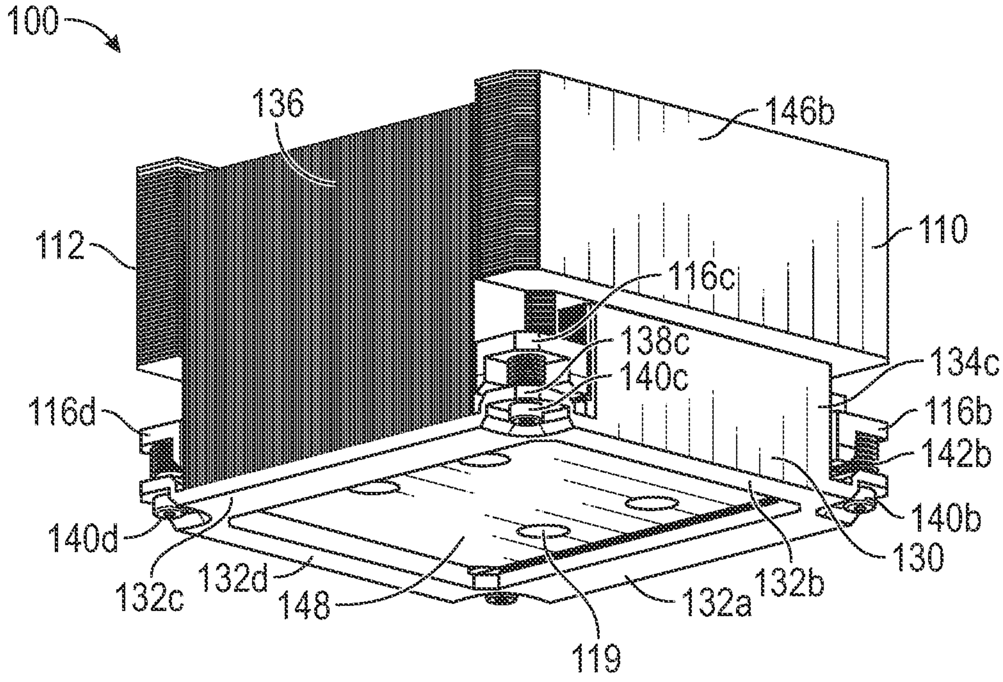
FIG. 3 is a lower rear left isometric view of an embodiment of a moat heatsink.

FIG. 2 is an upper front right isometric view of an embodiment of a "moat" heatsink 100. In FIG. 2, heatsink 100 includes a central CPU/GPU heatsink 110 configured to contact processor unit 12*a* (i.e., a "first heat source") and a "moat" heatsink 130 configured to contact VR rows 16*a* . . . 16*f* (i.e., a "second heat source"). CPU/GPU heatsink 110 includes fins 112 through which a first set of mounting tubes 118 and a second set of 114 heat pipe holes pass. Mounting tubes 118 are used to secure heatsink 110 against CPU/GPU 12*a* using fasteners into mounting holes 18*a* . . . 18*d* (FIG. 1). Heat pipe holes 114 receive heat pipes 122*a* . . . 122*k* of a heat pipe assembly 120. Heat pipes 122*a* . . . 122*k* are attached to a heat pipe base 148 (FIG. 3). Fins 112 are parallel and planar and bounded on two sides by face plates 146*a*, 146*b* (FIG. 3) such that a pair of fins and face plates 146*a*, 146*b* create a thin duct. Fins 112 are attached to base 115 (FIG. 7) that includes flanges 116*a* . . . 116*d*. Moat heatsink 130 includes finned lobes 134*a* . . . 134*c* and 136 and flanges 138*a* . . . 138*d*. Moat heatsink 130 is connected to CPU/GPU heatsink 110 by fasteners 140*a* . . . 140*d* though flanges 138*a* . . . 138*d* and into threaded holes in flanges 116*a* . . . 116*d*. Springs 142*a* . . . 142*d* bias flanges 138*a* . . . 138*d* away from flanges 116*a* . . . 116*d*. The fins of fin lobes 134*a* . . . 134*c* are oriented such that are parallel and planar and admit an airflow in the same direction as an airflow that passes through fins 112, as shown by the edges of fins on fin lobe 134*b* corresponding to the edges of fins 112 and the complete side of the external fin on fin lobe 134*a* corresponding to face plate 146*a*. A feature of the combination of fins 112 and fin lobes 134*a* . . . 134*c* is that, with both allowing airflow in the same direction, the cooling of both CPU/GPU and VRs is facilitated.

Figure 7:
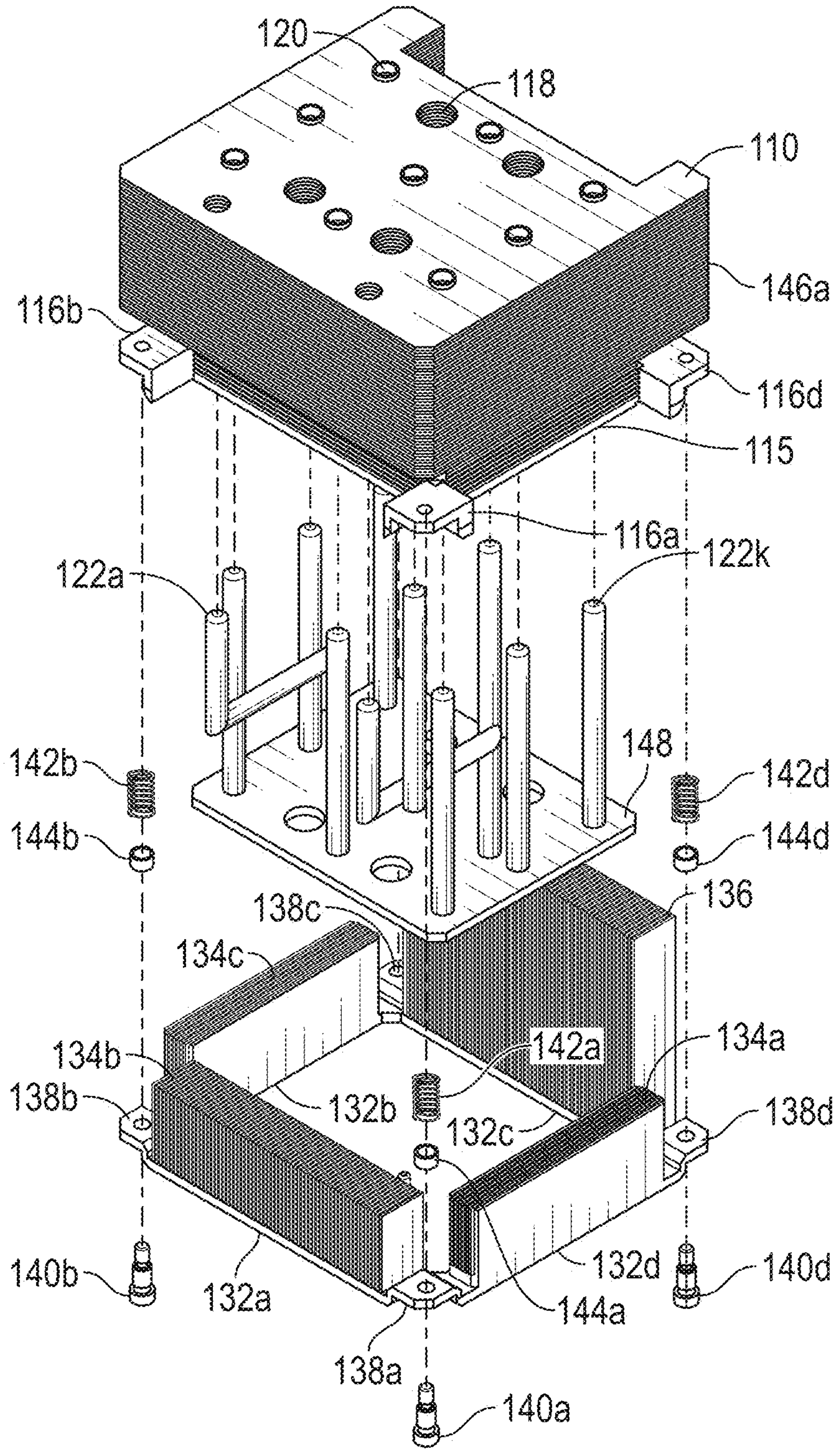
FIG. 7 is an upper front right assembly diagram of an embodiment of a moat heatsink.

As shown, and when mounted to CPU/GPU 12*a*, fin lobes 134*a* . . . 134*c* would contact VR rows 16*a* . . . 16*f*. When fasteners are inserted into tubes 118 and tightened, fins 112 and flanges 116*a* . . . 116*d* would be drawn down, compressing springs 142*a* . . . 142*d* against flanges 138*a* . . . 138*d*. Thus, heat pipe base 148 is sandwiched between base 115 (FIG. 7) of fins 112 against CPU/GPU 12*a*. The force of compressed springs 142*a* . . . 142*d* against flanges 138*a* . . . 138*d* forces faces 132*a* . . . 132*d* against VR rows 14*a* . . . 14*f*, which ensures the efficient transfer of heat from the VRs into fin lobes 134*a* . . . 134*c*. The compressive force of the fasteners themselves forces fin base 115 against base plate 148 (FIG. 3), and base plate 148 against GPU/CPU 12*a*, which ensures the efficient transfer of heat from CPU/GPU 12*a* into heat pipe base 148 and fin base 115 (FIG. 7).

In embodiments, fin lobes 134*a* . . . 134*c* may be varied in height to be tailored to the heat output of the associated VR row(s) such that the VRs are cooled optimally.

In an embodiment, heat pipes 122*a* . . . 122*k* and the associated holes 114 may be eliminated from fins 112 such that fins 112 are perforated only by mounting tubes 118.

FIG. 3 is a lower rear left isometric view of an embodiment of moat heatsink 100. In FIG. 3, heat pipe base 148 is shown to include mounting holes 119 that correspond in location to mounting tubes 118 of fins 112. Moat heatsink 130 is shown to include VR-contacting faces 132*a* . . . 132*d*. FIG. 3 illustrates that heat sink lobes may be sized differently to accommodate different heat dissipating requirements, with heatsink lobe 136 being substantially larger than any of lobes 134*a* . . . 134*c*. In fact, lobe 136 was extended vertically such that part of fins 112 wrap around lobe 136. As shown in FIG. 3, heat pipe base 148 is somewhat recessed or "above" VR-contacting faces 132*a* . . . 132*d*, which is an indication of the distance CPU/GPU heatsink 110 may be drawn down when securing heatsink 100—assuming CPU/GPU 12*a* and VRs rows 16*a* . . . 16*f* are at the same height on baseboard 10. Thus, that distance—the height of baseplate 148 above faces 132—is the distance springs 142*a* . . . 142*d* would be compressed when GPU/CPU 12*a* and VRs 16*a* . . . 16*f* are at the same height. In an embodiment, the lengths of fasteners 140*a* . . . 140*d* and the relative locations of flanges 138*a* . . . 138*d* and 116*a* . . . 116*d* may be modified to address CPU/GPU and VRs of different heights. Similarly, in embodiments, springs 142*a* . . . 142*d* may be sized to exert a desired force given a projected distance of compression.

Figure 4:
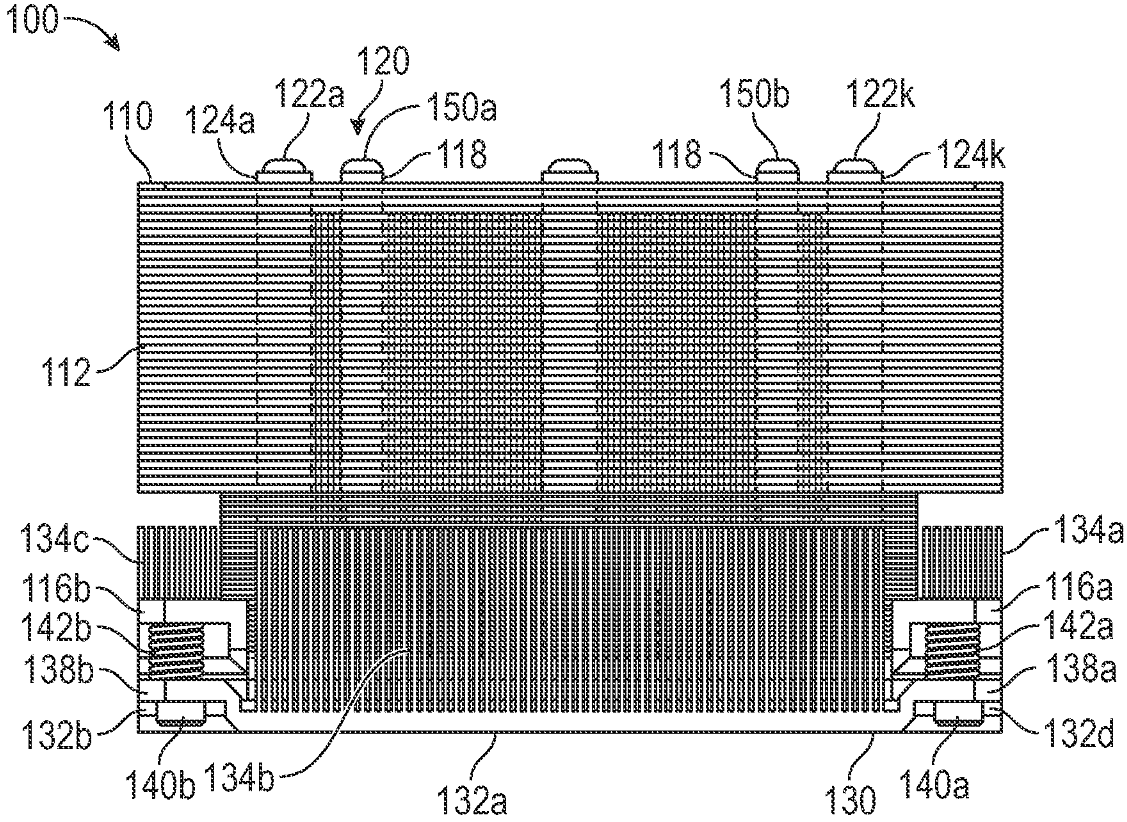
FIG. 4 is a front view of an embodiment of a moat heatsink.

FIG. 4 is a front view of an embodiment of moat heatsink 100, which illustrates that the orientation of fins 112 and of fin lobes 134*a* . . . 134*c* and 136 permit airflow in the same direction (into or out of the page in this view). FIG. 4 illustrates that heat pipes 122*a* . . . 122*k* pass through tubes 124*a* . . . 124*k* of heat pipe assembly 120, and that fasteners 150*a* . . . 150*d* extend through tubes 118 for connecting heatsink 100 to an CPU/GPU. FIG. 4 further illustrates that as flanges 116*a*, 116*b* are drawn down toward baseboard 10, fasteners 140*a*, 140*b* will similarly descend—the distance of descent allowed will depend on the height of the VRs above the baseboard, and what may be between fasteners 140*a*, 140*b* and the baseboard.

Figure 5:
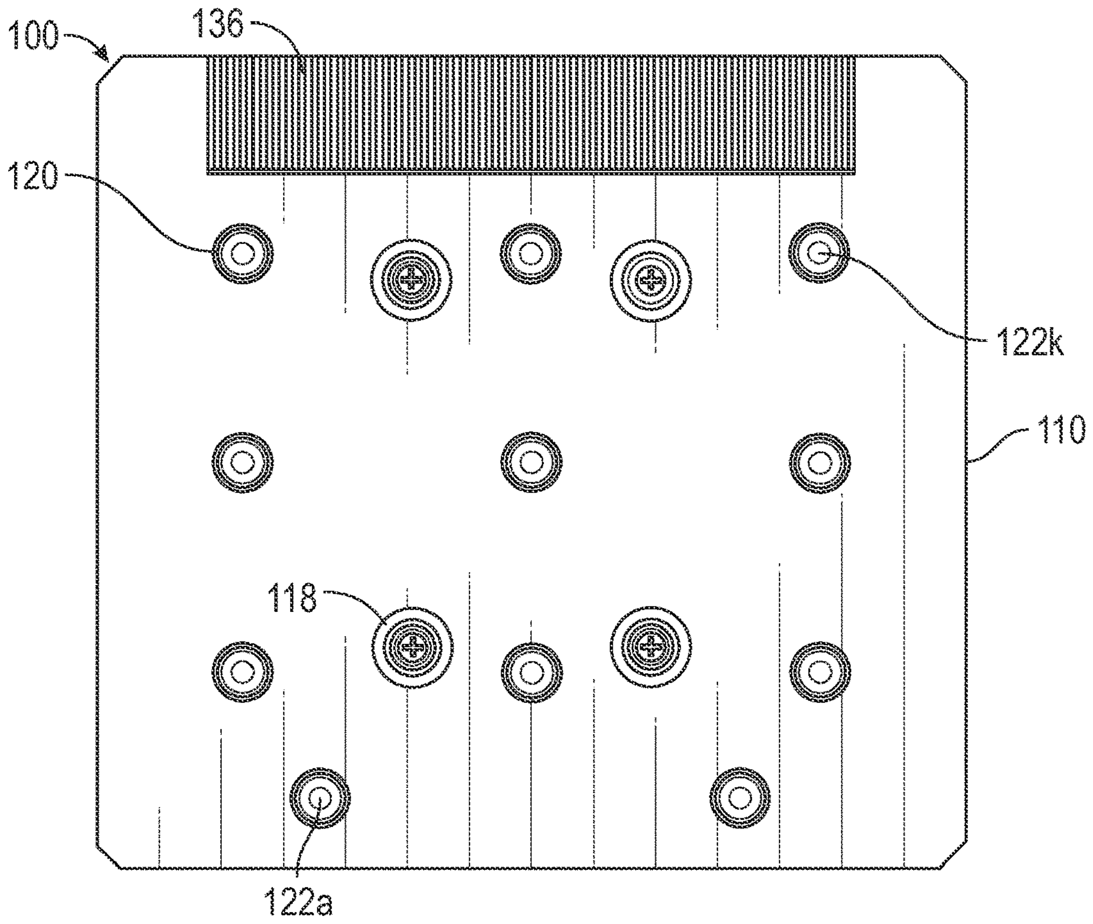
FIG. 5 is a top view of an embodiment of a moat heatsink.
Figure 6:
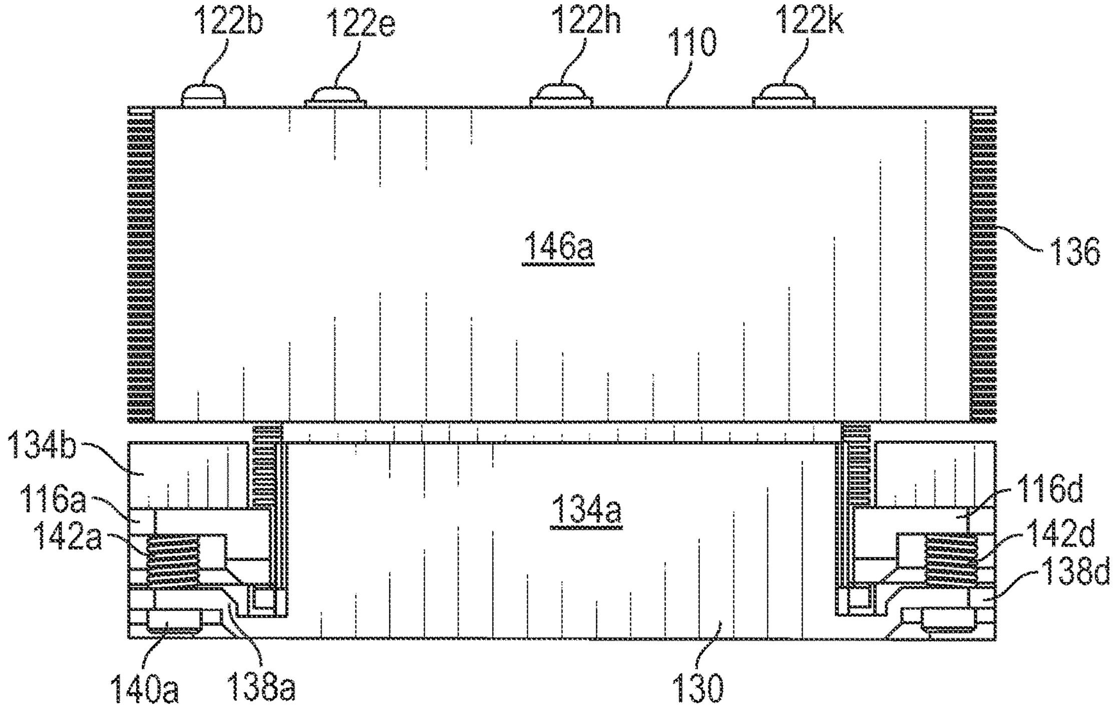
FIG. 6 is a right view of an embodiment of a moat heatsink.

FIG. 5 is a top view of an embodiment of moat heatsink, which illustrates: fasteners 150 within mounting tubes 118; heat pipes 122*a* . . . 122*k* within heat pipe tubes 124*a* . . . 124*k*; and the wrapping of elements of fins 112 about fin lobe 136. FIG. 6 is a right view of an embodiment of moat heatsink 100 in which the relative height difference between fin lobe 136 and fin lobes 134*a*, 134*b* is apparent.

FIG. 7 is an upper front right assembly diagram of an embodiment of moat heatsink 100. FIG. 7 illustrates the three main components: CPU/GPU heatsink 110, heat pip assembly 120, and moat heatsink 130. In particular, an exemplary configuration of heat pipes 122*a* . . . 122*k* is illustrated. In addition, fasteners 140*a* . . . 140*d* (140*c* is obscured) are shown to have sleeve 144*a* . . . 144*d* about them between flanges 138*a* . . . 138*d* and 116*a* . . . 116*d*. Springs 142*a* . . . 142*d* surround sleeves 144*a* . . . 144*d*. Thus, as springs 142*a* . . . 142*d* compress the sleeve keeps the spring separated from the fastener, which reduces the chance that the compressed spring may bind the fastener, which, if a binding occurred, might hinder the movement of CPU/GPU heatsink 110 toward CPU/GPU 12*a*.

Thus, some embodiments provide the following features: a "moat" VR heatsink covering VRs on four sides of the CPU/GPU; a heat sink where the CPU/GPU heatsink 110 is mechanically coupled to the VR heatsink 130, but the two heatsinks are thermally decoupled; a VR heatsink 130 in which individual heatsink lobes 134*a* . . . 134*c*, 136 may be customized (e.g., with fins of different configurations-height, thickness, material, etc.) to accommodate different VR heat transfer requirements, such as a pre-heat requirement on VR rows 16*a*, 16*b* accommodated by heatsink lobe 136; a screw-and-sleeve assembly for easy service; and a use of the pre-existing ADU heatsink mounting holes to secure both ADU heatsink 110 and VR heatsink 130.

Figure 8:
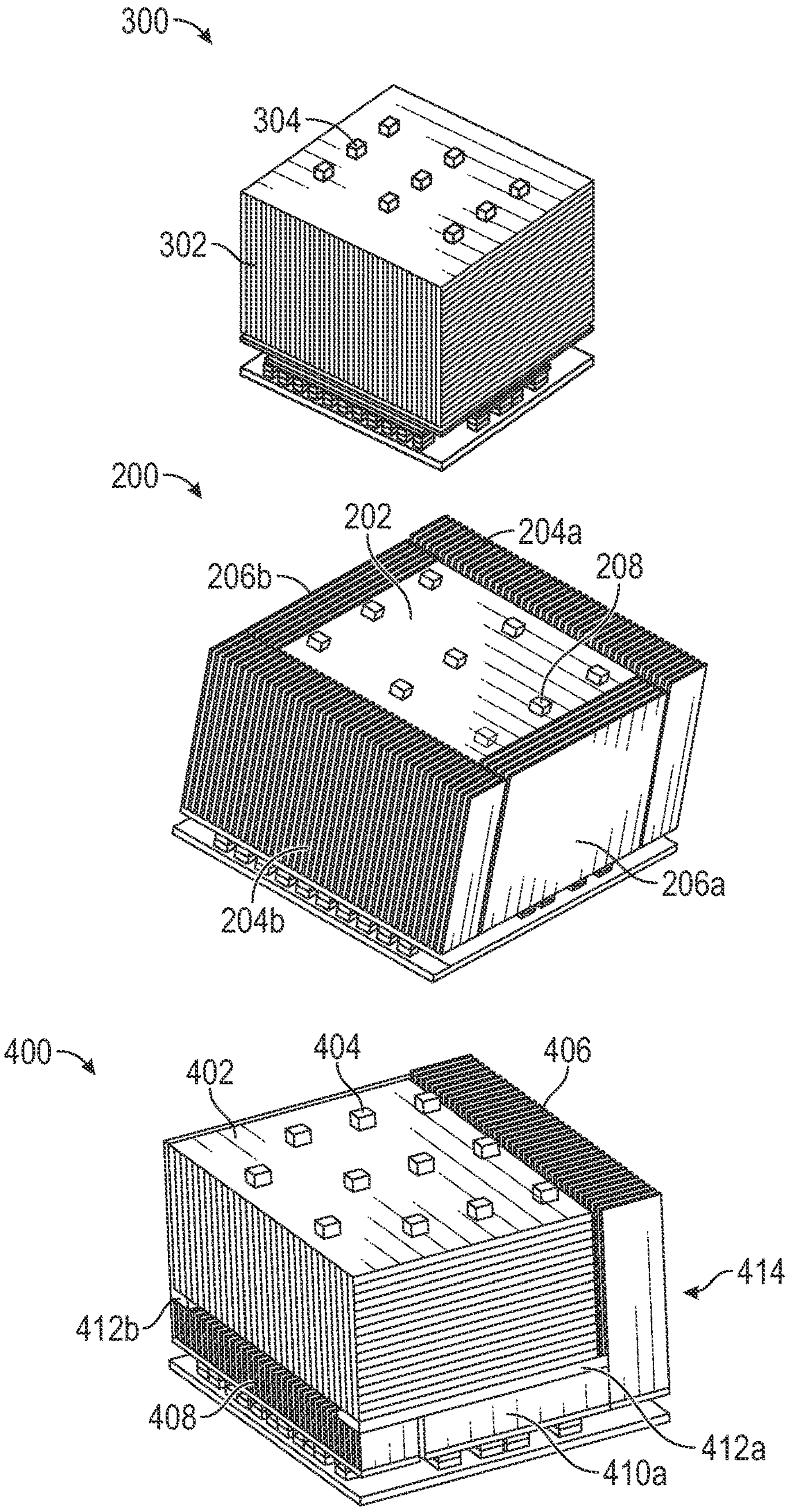
FIG. 8 illustrates three different types of heatsinks, one of which is an embodiment of a moat heatsink.

FIG. 8 illustrates three different types of heatsinks, one of which illustrates an embodiment of a moat heatsink. In FIG. 8, an embodiment 400 of a moat heatsink includes an CPU/GPU heatsink 402 and a VR heatsink 414. CPU/GPU heatsink 402 includes a heat pipe assembly 404. VR heatsink 414 includes heat sink lobes 406, 408, 410*a*, and 410*b* (obscured by heatsink 402). Moat heatsink 400 illustrates another possible configuration of CPU/GPU heatsink and VR heatsink. Moat heatsink 400 further includes elements 412*a*, 412*b*, which fill spaces between fins and prevent airflow through those spaces. Moat heatsink 400 is attached to the board using fasteners and mounting tubes 118, as with embodiment 100 although not shown in FIG. 8. FIG. 8 also illustrates a "full" heatsink 300 with a heat pipe assembly 304 within fins 302. Full heatsink 300 includes a single base for fins 302 and heat pipe assembly 304. The single base contacts both the CPU/GPU and all VRs. A "separate" heatsink 200 includes an CPU/GPU heatsink 202 and separate VR heatsinks 204*a*, 204*b*, 206*a*, 206*b*. Heatsink 200 is a "separate" heatsink in that each heatsink 202, 204*a*, 204*b*, 206*a*, and 206*b* is both thermally separate and mechanically separate, each being attached directly the corresponding CPU/GPU or VR row.

Heat sinks 200, 300, 400 were tested using the same CPU/GPU power and VR power: MI300C Simulation with 200 CFM @40 C ambient 549 W CPU power and 76 W VR power. The assumptions were as follows: MI300C CPU with HBM centric workload (549 W); 40 C ambient; and 76 W VR power (51 individual VRs). The results are summarized in Table 1.

TABLE 1

| | Full heatsink 300 | Separate heatsink 200 | Embodiment 400 |
|---|---|---|---|
| VR | 79 | 58 | 58 |
| Tcase_HBM | 78 | 79 | 75 |
| Tcase_GPU | 82 | 83 | 79 |
| Tcase_CPU | 83 | 84 | 79 |

It is noticed that CPU/GPU temperatures are lower in moat heatsink 400 than in full heatsink 300, and generally as good as or better than temperatures in separate heatsink 200. From the results, it is suggested that VR temperatures with moat heatsink 400 are lower than for full heatsink 300 because there is no cross-heating of heatsinks 416, 408, 410*a*, or 410*b* from CPU/GPU heatsink 402.

It may be concluded that moat heatsink 400 had better thermal performance for both CPU/GPU and VRs. In addition, moat heatsink 400 is both easier to service and install. These features may work to increase the reliability of the VRs, the board, and the overall system in general.

As described above, the "moat" heatsink extends around the entire periphery of the base of the CPU/GPU heatsink. One of skill will recognize that one or more partial or complete sides of the moat may be removed from the "moat" without departing from the teachings of this disclosure.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:

a first heat sink including a first plurality of fins and a base, the first plurality of fins having a plurality of tubes that extend to the base of the first heat sink, the base being configured to connect to a first heat source;

a second heat sink including a face, the second heat sink being connected to the base of the first heat sink;

a plurality of springs biasing the face of the second heat sink away from the base of the first heat sink along a first axis, the plurality of springs being configured to urge the face of the second heat sink against a second heat source when the base of the first heat sink is connected to the first heat source; and a plurality of fasteners configured to pass through the plurality of tubes and engage first heat source mounting holes such that when the fasteners are passed through the plurality of tubes and engage the first heat source mounting holes, the base of the first heat sink is connected to the first heat source and at least part of the face of the second heat sink is between the base of the first heat sink and the second heat source, which compresses the plurality of springs and urges the face of the second heat sink against the second heat source.

2. The apparatus of claim 1, further including a plurality of heat pipes connected to the first heat sink base and distributed within the first plurality of fins.

3. The apparatus of claim 2, wherein the plurality of heat pipes is distributed within a plurality of heat pipe holes in the first plurality of fins.

4. The apparatus of claim 3, wherein:

the first plurality of fins include the plurality of tubes that extend through the base of the first heat sink; and the plurality of heat pipes are connected to a heat-pipe base.

5. The apparatus of claim 4, wherein:

the face of the second heat sink comprises a plurality of faces;

each face of the plurality of faces includes a plurality of fins; and the plurality of second heat sink faces are distributed about a perimeter of the first heat sink base.

6. The apparatus of claim 5, wherein:

the first plurality of fins are parallel to a first plane;

each plurality of fins on each face of the plurality of faces are parallel to a second plane;

the first plane and the second plane are orthogonal.

7. The apparatus of claim 6, wherein:

the first plurality of fins includes a first face plate connected to a first side of the first plurality of fins and a second face plate connected to a second side of the first plurality of fins; and the first face plate and the second face plate are oriented parallel to the second plane.

8. The apparatus of claim 1, wherein:

the face of the second heat sink comprises a plurality of heat sink faces;

each face of the plurality of faces includes a plurality of fins; and the plurality of faces are distributed about a perimeter of the base of the first heat sink.

9. The apparatus of claim 8, wherein:

the first plurality of fins are parallel to a first plane;

each plurality of fins on each face of the plurality of faces are parallel to a second plane;

the first plane and the second plane are orthogonal.

10. The apparatus of claim 9, wherein:

the first plurality of fins includes a first face plate connected to a first side of the first plurality of fins and a second face plate connected to a second side of the first plurality of fins; and the first face plate and the second face plate are oriented parallel to the second plane.

11. The apparatus of claim 10, further including a plurality of heat pipes connected to the first heat sink base and distributed within the first plurality of fins.

12. The apparatus of claim 11, wherein the plurality of heat pipes is distributed within a plurality of heat pipe holes in the first plurality of fins.

13. The apparatus of claim 12, wherein:

the first plurality of fins include the plurality of tubes that extend through the base of the first heat sink;

the second heat source comprises a plurality of second heat sources; and the plurality of heat pipes are connected to a heat-pipe base including a plurality of mounting holes, the apparatus further comprising the plurality of fasteners configured to pass through the plurality of tubes and the plurality of mounting holes and engage the first heat source mounting holes such that when the fasteners are passed through the plurality of tubes and the plurality of mounting holes and engage the first heat source mounting holes, the first heat sink base is connected to the first heat source with the heat pipe base between the first heat sink base and the first heat source, and at least part of each second heat sink face is between the first heat sink base and at least one second heat source of the plurality of second heat sources, which compresses the plurality of springs and urges each second heat sink face against a respective one of the at least one second heat source.

14. A system comprising:

a circuit board mounted to a chassis, the circuit board having a first heat source and at least one second heat source;

a heatsink assembly including i) a first heat sink having a first plurality of fins and a base, the first plurality of fins having a plurality of tubes that extend to the base of the first heat sink, the first heat sink being mounted to and in thermal contact with the first heat source, ii) a second heat sink in thermal contact with the second heat source and having a face, the second heat sink being connected to the base of the first heat sink, iii) a plurality of springs configured to bias the second heat sink face away from the first heat sink base and toward the second heat source along a first axis, and iv) a plurality of fasteners passing through the plurality of tubes and engaging first heat source mounting holes, the base of the first heat sink being connected to the first heat source and at least part of the face of the second heat sink being between the base of the first heat sink and the second heat source thereby compressing the plurality of springs and urging the face of the second heat sink against the second heat source.

15. The system of claim 14, further including a plurality of heat pipes connected to the first heat sink base and distributed within the first plurality of fins.

16. The system of claim 15, wherein the plurality of heat pipes is distributed within a plurality of heat pipe holes in the first plurality of fins.

17. The system of claim 16, wherein the first plurality of fins includes the plurality of tubes that extend through the base of the first heat sink, and wherein the plurality of heat pipes are connected to a heat-pipe base including a plurality of mounting holes.

18. The system of claim 14, wherein the face of the second heat sink comprises a plurality of faces distributed about a perimeter of the base of the first heat sink, each face of the plurality of faces including a plurality of fins.

19. A method comprising:

providing a heatsink assembly including: i) a first heat sink having a first plurality of fins and a base, the first plurality of fins having a plurality of tubes that extend to the base of the first heat sink, the base being configured to connect to a first heat source, ii) a second heat sink having a face, the second heat sink being connected to the base of the first heat sink, iii) a plurality of springs configured to bias the face of the second heat sink away from the base of the first heat sink along a first axis, and iv) a plurality of fasteners configured to pass through the plurality of tubes and engage first heat source mounting holes;

mounting the base of the first heat sink to the first heat source on a circuit board by passing the fasteners through the plurality of tubes to engage the first heat source mounting holes such that the first plurality of fins is in thermal contact with the first heat source through the base of the first heat sink and at least part of the face of the second heat sink is between the base of the first heat sink and a second heat source thereby enabling transfer of heat from the first heat source to the base of the first heat sink; and compressing the plurality of springs along the first axis during the mounting of the first heat sink to the first heat source to urge the face of the second heat sink against the second heat source and thereby enable transfer of heat from the second heat source to the face of the second heat sink.

* * * * *